(12) United States Patent
Chintamani

(10) Patent No.: US 7,496,154 B2
(45) Date of Patent: Feb. 24, 2009

(54) POWER AND AREA EFFICIENT RECEIVER CIRCUIT HAVING CONSTANT HYSTERESIS FOR NOISE REJECTION

(75) Inventor: Keshav Bhaktavatson Chintamani, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 622 days.

(21) Appl. No.: 11/160,448

(22) Filed: Jun. 23, 2005

(65) Prior Publication Data

US 2006/0251187 A1    Nov. 9, 2006

(30) Foreign Application Priority Data

May 6, 2005    (IN)    ........................... 535/CHE/2005

(51) Int. Cl.
 *H03K 9/00*    (2006.01)
(52) U.S. Cl. .................. 375/316; 324/166; 327/20; 327/227
(58) Field of Classification Search ................. 375/316; 324/166; 327/20; 250/338.1; 340/384.1; 367/96
See application file for complete search history.

(56) References Cited

U.S. PATENT DOCUMENTS

| | | | | |
|---|---|---|---|---|
| 5,012,207 A * | 4/1991 | Edwards | ...................... | 324/166 |
| 5,079,419 A * | 1/1992 | Falbel | ...................... | 250/338.1 |
| 6,392,446 B1 * | 5/2002 | Reasoner et al. | .............. | 327/20 |
| 7,068,734 B2 * | 6/2006 | Bois et al. | ..................... | 375/316 |
| 7,136,429 B2 * | 11/2006 | Bois et al. | ................... | 375/316 |

* cited by examiner

*Primary Examiner*—Sudhanshu C Pathak
(74) *Attorney, Agent, or Firm*—Alan K. Stewart; W. James Brady; Frederick J. Telecky, Jr.

(57) ABSTRACT

A hysteresis receiver containing two inverters and a logic controller. The inverters are implemented with threshold voltages equaling Vil and Vih, which together define the hysteresis window. The inverters receive the input signal and generate a respective inverted value. The logic controller propagates as output one of the two inverted values if the two inverted values are equal, and a prior value (corresponding to a previous sample) if the two inverted values are not equal. A receiver circuit with a hysteresis window defined by Vil and Vih, is obtained as a result.

5 Claims, 5 Drawing Sheets

US 7,496,154 B2

POWER AND AREA EFFICIENT RECEIVER CIRCUIT HAVING CONSTANT HYSTERESIS FOR NOISE REJECTION

RELATED APPLICATION(S)

The present application is related to and claims priority from the co-pending India Patent Application entitled, "Power and Area Efficient Receiver Circuit Having Constant Hysteresis For Noise Rejection", Serial Number: 535/CHE/2005, Filed: May 6, 2005, naming the same inventors as in the subject patent application, and is incorporated in its entirety herewith.

BACKGROUND OF THE INVENTION

1. Field of the Invention

The present invention relates to the field of design of electronic circuits, and more specifically to design and implementation of a power and area efficient hysteresis circuit having constant hysteresis for noise rejection.

2. Related Art

Receiver circuits are generally provided in various devices to propagate input signals received from external components (e.g., boards, devices, etc.) to internal components. Typically, a receiver circuit isolates the internal components from the external components, in addition to shifting logical voltage levels of input signal (generally higher) to required (lower) voltage level of the internal components.

One general requirement with receiver circuits is to consistently reject the noise signals that are often coexistent with the input signal. Noise rejection leads to advantages such as reliable recovery of the data represented by the input signals, etc., as is well known in the relevant arts.

In one approach, receiver circuits are implemented with hysteresis property to reject such noise. Hysteresis property generally refers to a behavior in which, as a parameter (in this case input voltage signal) is increased, the behavior (in this case output voltage of receiver circuit) makes a sudden jump (transition) at a particular value and as the parameter is then decreased, the jump back (transition) to the original behavior does not occur until a much lower value of the parameter. A receiver having such hysteresis property is often referred as a hysteresis receiver.

The manner in which a hysteresis design (within the receiver circuit) rejects noise associated with an input signal is further explained with the reference to the graphs of FIGS. 1A, 1B and 1C. In particular, FIGS. 1A and 1B respectively illustrate the hysteresis behavior of a hysteresis receiver in voltage and time domain, and FIG. 1C depicts the manner in which the hysteresis receiver rejects noise.

With respect to FIG. 1A, the X and Y axis respectively represent input voltage and output voltage of hysteresis receiver. The path corresponding to the arrow marks in the forward (from left to right) direction indicates that the output voltage jumps from 0 to Vdd at input voltage of Vih, and the voltage stays at Vdd as the input voltage is increased further. On the other hand, the path corresponding to the arrow marks in the reverse (from right to left) direction indicate that the output voltage falls from Vdd to 0 at input voltage of Vil (wherein Vil is less than Vih). The window Vih (upper bound) to Vil (lower bound) is referred to as the hysteris window. A time domain representation of hysteresis behavior is described below with respect to FIG. 1B for a clearer understanding.

FIG. 1B is a graph illustrating the variation of output voltage with respect to input voltage in time domain for a hysteresis receiver. Curve 150 represents the voltage of an input signal without noise and curve 160 represents the desired output signal. While the output signal is at logic low value, a transition in output signal from logic low to logic high requires that the voltage level of input signal increase to above Vih. Similarly, while the output signal is at logic high value, a transition in output signal from logic high to logic low requires that the voltage level of input signal fall below Vil.

As a result, any input fluctuation (due to noise) within hysteresis window 140 (region between Vil and Vih) is ignored by receiver and only transition beyond the hysteresis window is recognized as a valid change in input signal level, and the corresponding output signal is propagated to the internal components. Various noise signals are removed as a result. The reasons underlying the removal of noise (in FIG. 1B above) can be appreciated by considering a zero-hysteresis receiver (i.e., hysteresis window equaling 0). The operation of such a receiver is described below with reference to FIG. 1C.

FIG. 1C is a graph illustrating the propagation of false bits by a zero hysteresis receiver in the presence of noise in the input signal. Curve 170 represents input voltage signal with noise and curve 180 represents the corresponding output signal. Points 171, 172 and 173 represent variations in input signal crossing zero hysteresis line (Vil=Vih) due to noise as input voltage increased. Similarly points 176, 177, 178 represent points due to noise as input voltage is decreased.

False bits or glitches (fast transition) are generated as output signal at points 171-173 and 176-178. It may be appreciated that as the hysteresis window widens, input signal does not intersect Vil or Vih at points 171-173 and 176-178, hence preventing propagation of false bits or glitches to the internal component(s). Accordingly, there is a general need to implement receivers with hysteris (at least to eliminate noise).

Hysteresis receivers need to be implemented with various requirements. One requirement is that the hysteresis window be at least substantially constant ("constant hysteresis"). Another general requirement is that the implementations do not consume substantial area and/or electrical power. What is therefore needed is a power and area efficient hysteresis receiver having constant hysteresis for noise rejection.

BRIEF DESCRIPTION OF THE DRAWINGS

The present invention will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A hysteresis receiver provided according to an aspect of the present invention contains two inverters and a logic controller. The inverters are implemented with threshold voltages (the input voltage at which the inverter changes output value) equaling Vil and Vih, which together define the hysteresis window. The inverters receive the input signal and generate a respective inverted value. The logic controller propagates as output one of the two inverted values if the two inverted values are equal, and a prior value (corresponding to a previous sample) as output if the two inverted values are not equal. A receiver circuit with a hysteresis window defined by Vil and Vih, is obtained as a result.

Various aspects of the present invention will be clearer in comparison to a prior hysteresis circuit. Accordingly, such a prior hysteresis circuit is described first below.

2. Prior Hysteresis Receiver

Figure 1A:
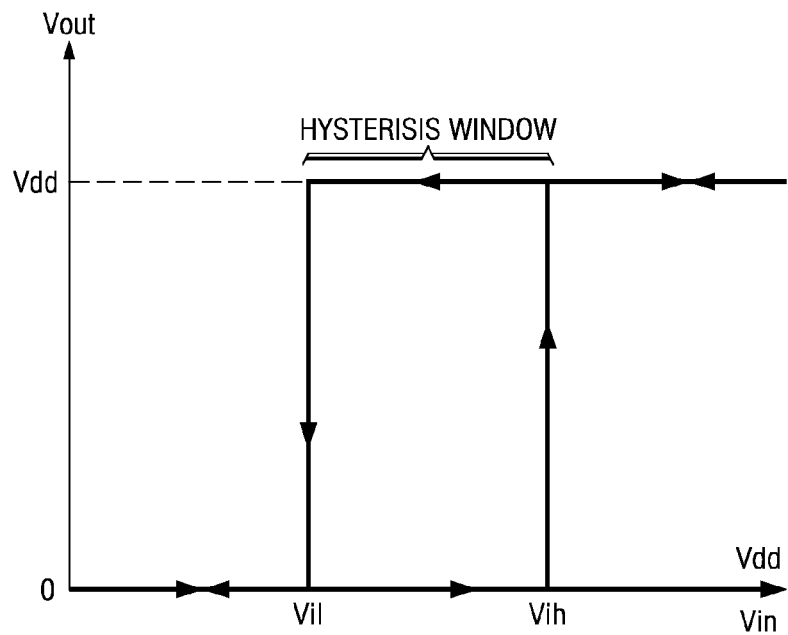
FIG. 1A contains a graph illustrating the general concept of hysteresis in voltage domain.
Figure 1B:
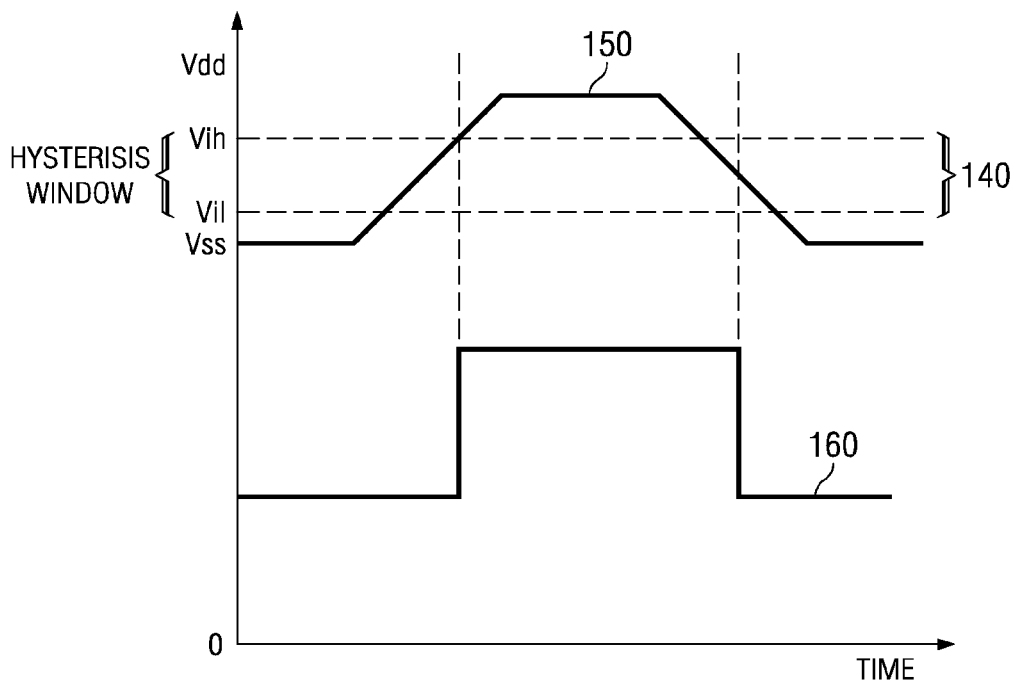
FIG. 1B contains a graph illustrating the general concept of hysteresis in time domain.
Figure 1C:
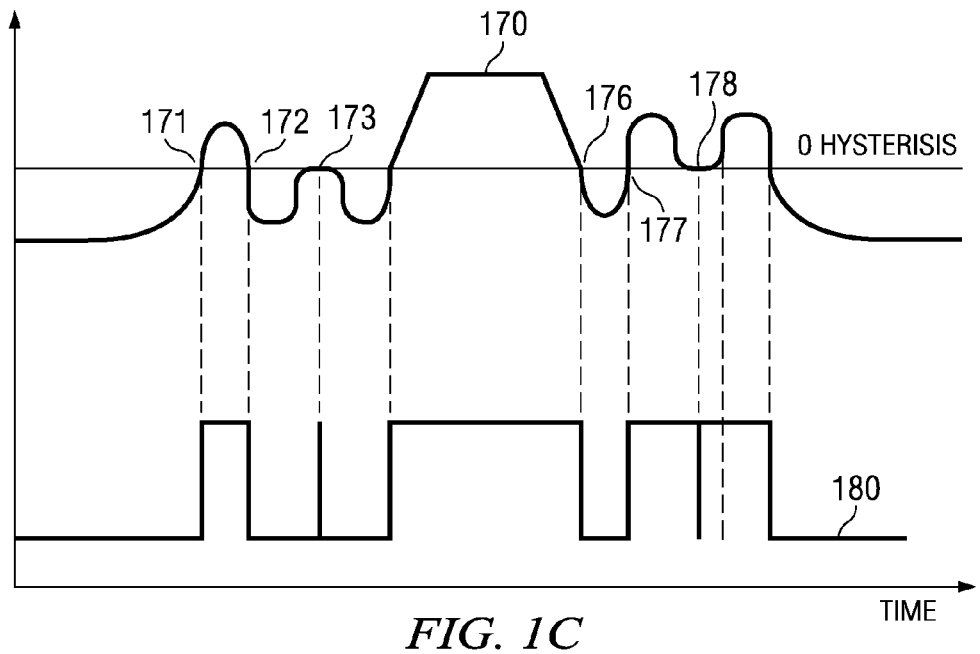
FIG. 1C contains a graph illustrating the manner in which hysteresis causes a receiver circuit to be immune to noise of certain strength.
Figure 2:
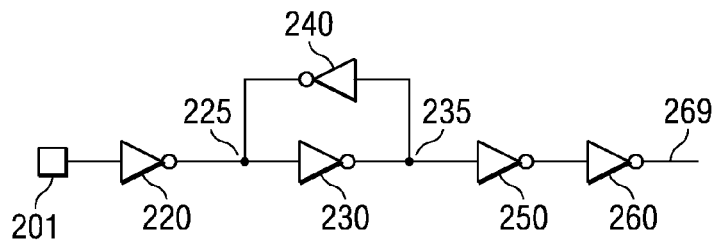
FIG. 2 is a circuit diagram of a prior receiver circuit.

FIG. 2 is a circuit diagram illustrating the details of an example prior hysteresis receiver. The circuit is shown containing inverters 220, 230, 240, 250 and 260. Each component is described below in further detail.

Inverter 250 operates to provide level shifting from external logic voltage level to internal chip (i.e., components connected to path 269) logic voltage level, and inverters 250 and 260 together perform respective two inversion operations to provide (on path 269) the same logic state presented on the node 235. Inverter 230 inverts a signal on node 225 when the strength of the signal at node 225 attains a desired value.

Feedback inverter 240 inverts signal on node 235 and presents inverted signal on node 225. Main inverter 220 inverts input signal and presents inverted input signal on node 225. When input signal 201 is at logic level low or high, the outputs of feed back inverter 240 and main inverter 220 are in the same state. While input signal 201 transitions from one logic level to another logic level, the output of main inverter 220 and output of feedback inverter 240 oppose each other at node 225. As a result, during transition, the voltage level on node 225 is the resultant of output strength of main inverter and output strength of feed back inverter.

The above configuration of the inverters operates to provide hysteresis as described below in further detail with an example. As may be appreciated from the above description, hysteresis operates to block noise signals, as well as provide transitions at two different voltage levels of the input signals. Accordingly, the blocking and transitions are described below.

When the input signal 201 (while in transition) crosses a threshold value corresponding to main inverter 220, the main inverter output tries to perform an opposite transition (inverting). However due to the opposing voltage from feed back inverter 240, total voltage level on node 225 (lesser by a amount proportional to feedback strength) may not be sufficient for triggering inverter action from inverter 230, thereby blocking propagation of input signal to remaining components of the circuit.

However, when input signal 201 (while transitioning to a logic high) attains sufficiently high level, the output transition becomes stronger to overcome the feedback and force a transition to trigger the inverter action from inverter 230, hence propagating input signal to remaining components in the circuit. As a result, the logic value of input signal is effectively propagated by the circuit for two different threshold values thereby providing hysteresis.

Thus, the desired effects of hysteresis are realized by the circuit of FIG. 2 when a transition occurs from logic low to logic high (when the strength of input signal exceeds Vih). Desired effects are similarly realized from logic high to low, as will be apparent by analyzing the circuit of FIG. 2.

However, there are several disadvantages with the circuit of FIG. 2, as described below in further detail.

3. Disadvantages of Prior Hysteresis Receiver

One disadvantage with the circuit of FIG. 2 is that different fabricated units may provide different hysteresis windows. The reason for such differences lies in the potential difference in doping levels in the respective main inverters and feedback inverters, (due to variations in the fabrication process) leading to different drive (voltage/current) strengths of the transistors controlling the voltage level at node 225. In general, it is desirable that all fabricated units provide the same hysteresis window.

Another disadvantage of the circuit of FIG. 2 is that the circuit may consume a substantial amount of power since the inverters 220 and 230 would drive opposite logic during transition (at least in embodiments implemented using transistors).

In addition, the circuit of FIG. 2 could require inverters 220, 230, 240 and 250 to be implemented using large transistors, since the inverters need to operate at high input voltage levels. In other words, only transistor 250 causes the transition to lower voltage levels, and thus inverters located before transistor 250 in the signal path would need to be implemented using large transistors. Large transistors generally consume more space and power, and thus may be undesirable.

The manner in which various aspects of the present invention overcome some of the disadvantages of above, is described below in further detail below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

4. Novel Hysteresis Receiver

Figure 3:
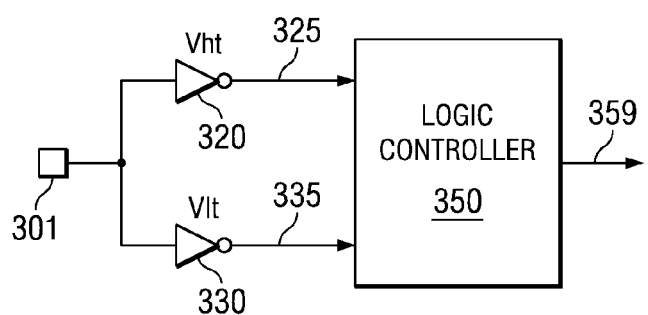
FIG. 3 is a circuit diagram illustrating the details of a receiver circuit in an embodiment of the present invention.

FIG. 3 is block diagram illustrating implementation of a hysteresis receiver implemented according to various aspect of present invention. The block diagram is shown containing inverters 320 and 330, and logic controller 350.

Inverters 320 and 330 are implemented with different respective threshold values Vih and Vil respectively, and both receive the input signal simultaneously from 301. A threshold for an inverter refers to a voltage level at which the inverter is triggered to transition from one logic value to the other (perform the inversion action). As a result, inverter 330 having lower threshold (Vil) produces inverted logic at a lower input signal strength, and inverter 320 having higher threshold (Vih) produce inverted output when input signal attains a higher strength. Inverted output from inverter 320 and 330 are presented to logic controller 350.

Logic controller 350 generates logic values (representing the output of the receiver circuit) based on the outputs of the inverters 320 and 330. The generated logic value is presented to the internal components (core processing unit), thereby effectively propagating input logic to the chip eliminating noise. It should be understood that the outputs of inverters 320 and 320 together contain the necessary information to provide the desired hysteresis characteristics, and thus the (receiver) output can be generated based on the information. The manner in which an embodiment of logic controller 350 generates logic values is illustrated below with reference to FIG. 4.

5. Approach in Logic Controller

Figure 4:
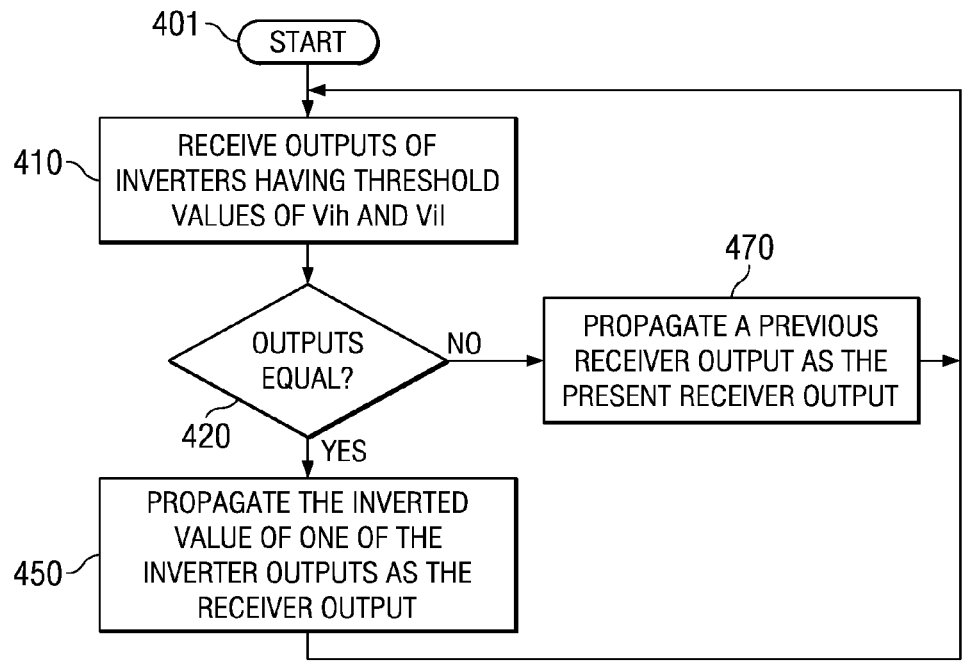
FIG. 4 is a flow chart illustrating the operation of a logic controller in an embodiment of the present invention.

FIG. 4 is a flow chart describing manner in which logic controller 350 generates logic value based on the outputs of the inverters 330 and 320, in one embodiment. The flowchart begins in step 401 and control immediately passes to step 410.

In step 410, logic controller 350 receives the outputs of inverter having different thresholds and compares the received inverter outputs in step 420. If both outputs of the inverter are of same logic level then control passes to step 450, else control passes to 470.

In step 450, logic controller 350 propagates the inverted value of one of the inverter outputs as the present receiver output. In general, the receiver output is provided consistent with the voltage level requirements of the internal components. Control then passes to step 410.

It can be readily appreciated that the output of both inverters 320 and 330 would equal 1 if the input signal is at a voltage level below Vil. On the other hand, the output of both inverters 320 and 330 would equal 0 if the input signal is at a voltage level above Vih. In both cases, the inverted value of the output of the inverters is propagated to path 359.

In step 470, logic controller 350 maintains a previous logic value that was propagated on path 359, and control again passes to step 410 to process the next sample on the input signal.

Due to the operation according to FIG. 4, the receiver circuit of FIG. 3 operates to provide hysteresis with a window having boundaries of the first threshold and the second threshold. Logic controller 350 can be implemented using several approaches. An example implementation of logic controller 350 is described below in further detail.

6. Circuit Implementation of Logic Controller

Figure 5:
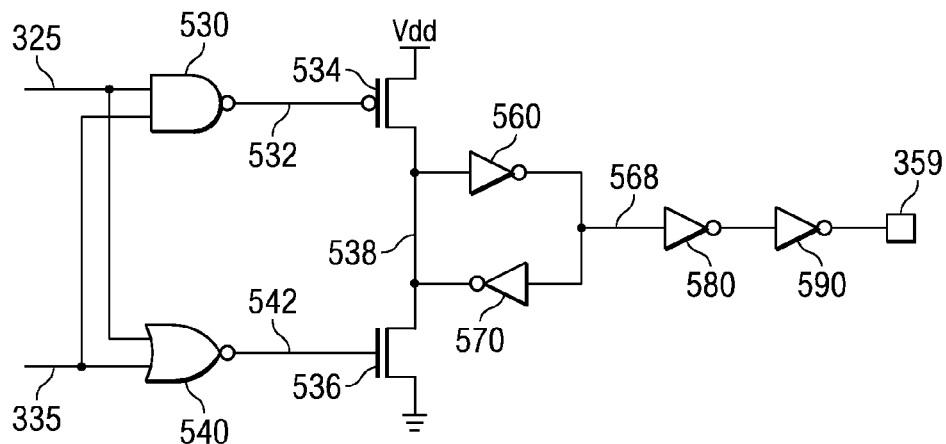
FIG. 5 is a circuit diagram illustrating the implementation of a logic controller in an embodiment of the present invention.

FIG. 5 is a circuit diagram illustrating an example implementation of logic controller 350 in one embodiment. The circuit diagram is shown containing inverters 560, 570, 580 and 590, NAND gate 530, NOR gate 540, and PMOS transistor 534 and NMOS transistor 536. Each component is described below in further detail.

NAND gate 530 performs a logical NAND operation on inputs received on paths 525 and 535, and the output (532) of the NAND gate 530 is presented to an internal pull-up transistor 534. Similarly, NOR gate 540 performs a logical NOR operation on inputs received from inverters 510 and 520, and output (542) of the NOR gate is presented to an internal pull-down transistor 536.

It should be apparent that NAND gate 530 provides a logic 0 on path 532 only when both the inputs on paths 325 and 335 are at logic high. As a result, internal pull-up transistor 534 sets node 538 at logic 1 when inputs on paths 325 and 335 are at logic high. Similarly, NOR gate 540 provides a logic 1 on path 542 only when both the input on path 325 and 335 are at logic low. As a result, internal pull-down transistor 536 sets node 538 at logic 0 when both the input on path 325 and 335 are at logic low. When the input on path 325 and 335 are at different logic (01 and 10) paths 532 and 542 are respectively at logic 1 and logic 0, thereby disabling both transistors 534 and 536. As a result, node 538 remains isolated from the input.

Inverter 570, in combination with inverter 560, operates to maintain node 568 at the same logic level when node 538 is isolated from the input. As may be appreciated, such isolation state is present when inputs 325 and 335 are at different logic levels. Thus, consistent with step 470 (when output values are determined unequal in step 420), the previous value is maintained at node 568.

Inverter 560 inverts the value on node 538, and the inverted value is presented on node 568. Thus, when paths 325 and 335 are at 0, the 0 logic value present at node 538 is inverted and presented on path 568. When paths 325 and 335 are at 1, the logic 1 present at node 538 is inverted and presented on path 568. Inverters 580 and 590, connected in series, operate as a buffer, and the output of the buffer is provided to internal components on path 359.

Thus, the circuit of FIG. 5 implements the approach of FIG. 4 to provide hysteresis characteristic in a receiver circuit. It should be understood that the receiver circuit thus provided, has several advantages compared to the prior circuit of FIG. 2. For example, lower power may be consumed (in the circuit according to FIG. 3) due to the absence of the opposing forces at nodes.

In addition, the solutions may be independent of fabrication process, temperature and/or voltage (PTV) variations since both inverters would be impacted similarly by such factors. Furthermore, the circuit of FIG. 3 may be implemented using small transistors since inverters 320 and 330 can be implemented to shift the level to the desired (low) level.

However, as described above, inverters 320 and 330 are respectively implemented with threshold voltages of Vil and Vih (defining the boundaries of hysteresis window). The manner in which such inverters (having different thresholds) can be implemented is described below in further detail.

7. Inverters with Different Thresholds

Figure 6A:
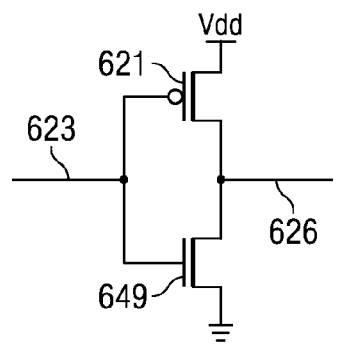
FIG. 6A is a circuit diagram illustrating the implementation of an inverter in one embodiment.

FIG. 6A is a circuit diagram illustrating the details of an example inverter circuit. The circuit diagram is shown containing PMOS transistor 621 and NMOS transistor 649, and are described below in further detail.

The gate terminals of transistors 621 and 629 are connected to each other at input node 623, and the input signal is received on input node 623. Similarly, the drain terminals of transistors 621 and 629 are connected to output node 626 and output is obtained from output node 626. The source terminal of the PMOS transistor is connected to VDD and the source terminal of the NMOS transistor is connected to ground.

When the input terminal is at logic high (voltage having VDD value) PMOS transistor 621 operates in cutoff region (high resistance) and NMOS transistor 649 operates in linear region (low resistance), thereby effectively connecting VDD to output node representing a logic high. When the input terminal is at logic low (voltage having zero value), PMOS transistor operates in linear region and NMOS operates in cutoff region, thereby effectively connecting ground to output node hence output will be at logic low (zero value). As a result a inverted input logic value is provided at output node 626.

However voltage (threshold) level at which PMOS and NMOS transistors provides inverted input logic as output is determined by the ratio of the width of the NMOS and PMOS transistors. The manner in which the threshold varies with respect to the ratio is illustrated below with reference to FIG. 6B.

Figure 6B:
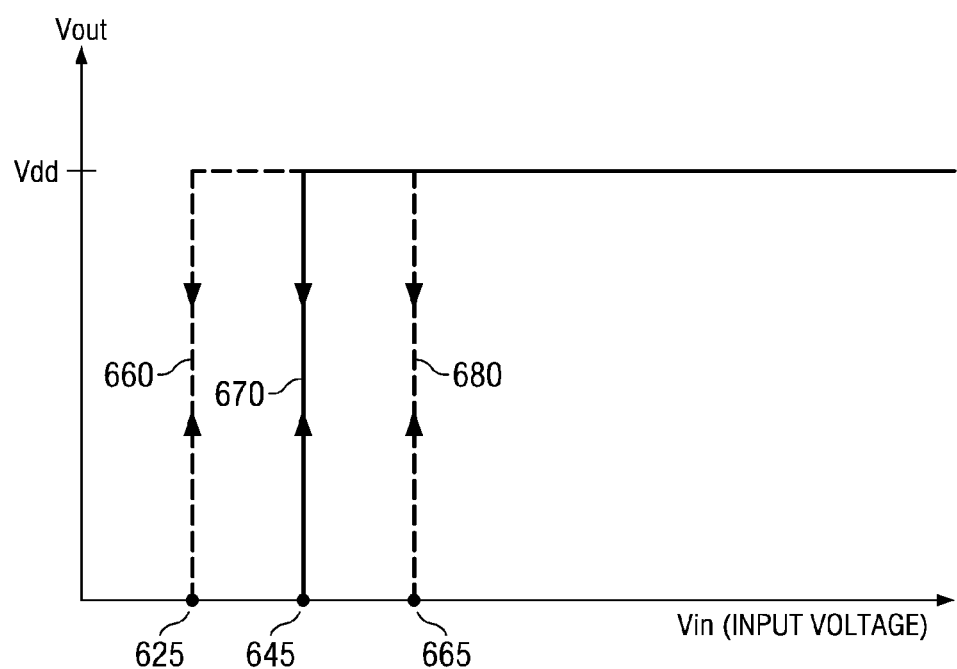
FIG. 6B is a graph illustrating the manner in which inverters of desired threshold voltages can be obtained in an embodiment of the present invention.

FIG. 6B is a graph with curves 660, 670 and 680 illustrating transfer curve (output Vout on Y-axis, responsive to the input Vin) of inverter 600 corresponding to different ratios of the width of PMOS (P) and NMOS transistor (N). Curve 670 represents a transfer curve with a threshold of VT1 corresponding to a value of P equal to N. Curve 680 represents a transfer curve with threshold VT2 corresponding a value of P greater than N and curve 660 represents a transfer curve with threshold VT3 corresponding to a value of P less than N.

Thus, it may be appreciated that, a inverter having desired threshold value can be obtained by appropriately selecting the widths of the PMOS and NMOS transistors (from FIG. 6B) used to implement the inverter. The approaches above can be implemented in various systems. An example system implementing the approaches is described below.

8. System

Figure 7:
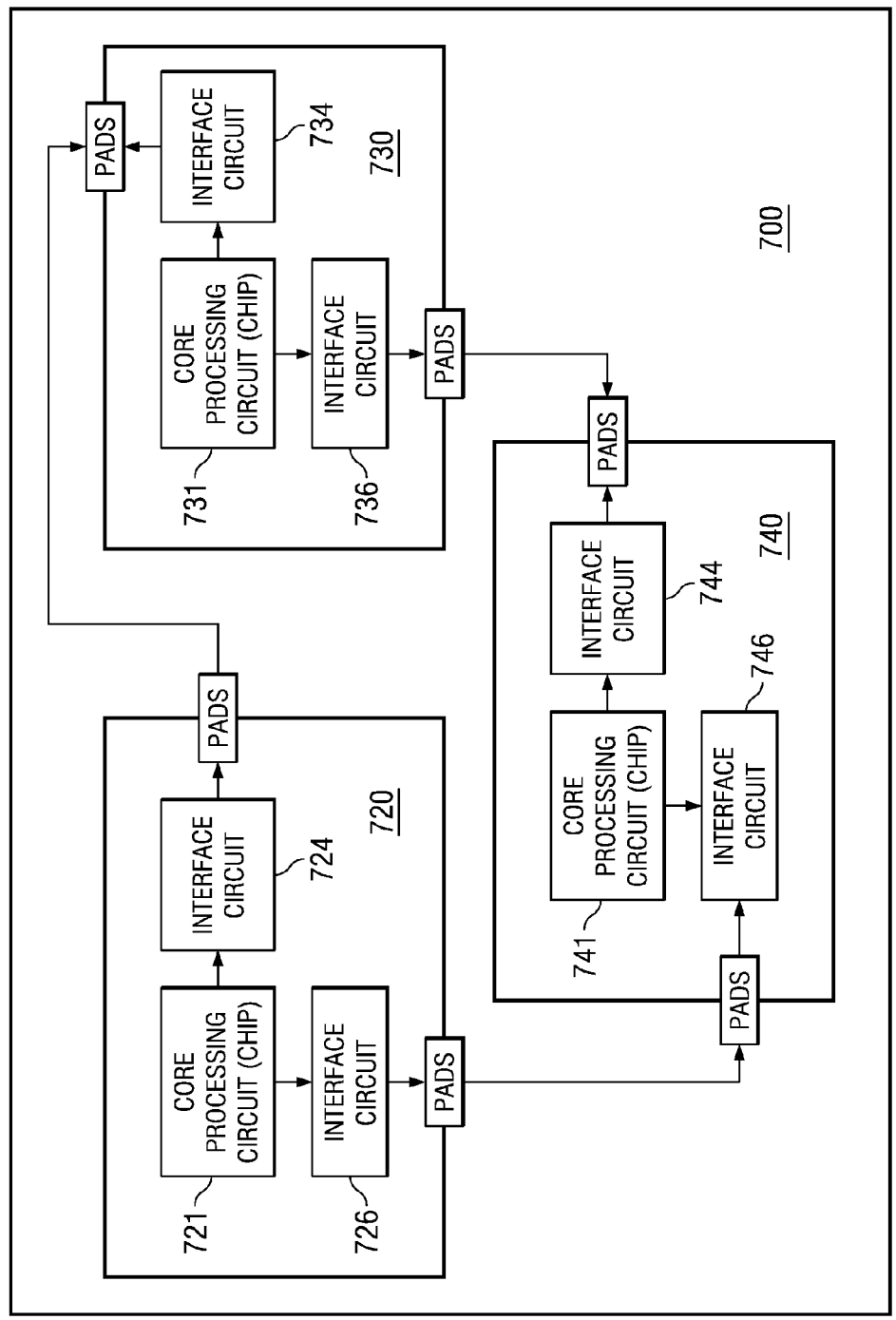
FIG. 7 is a block diagram illustrating the details of an example system implemented according to various aspects of the present invention.

FIG. 7 is a block diagram illustrating an example system in which various aspects of the present invention are implemented. The system is shown containing boards 720, 730 and 740, with board 720 containing core processing unit 721 and interface circuits 724 and 726, board 730 containing core processing unit 731 and interface circuits 734 and 736, and board 740 containing core processing unit 741 and interface circuits 744 and 746. Further description is provided with reference to board 720 for illustration, however the description is applicable to other boards as well.

Core processing unit 721 receives data bits from the interface circuits 724 and 726 and processes the received data bits according to desired applications. Core processing unit 721 may perform various operations such as storing in to memory, mathematical operations etc. Interface circuits 724 and 726 respectively receive input signals from boards 730 and 740 and generates data bits. Data bits generated from the input signals are provided to processing circuit 721 (internal component).

Interface circuits 724 and 726 are implemented according to the descriptions provided above with respect to FIG. 3. Processing circuit 721 processes the data bits to provide various user applications. Interface circuits 724 and 726 provides a constant hysteresis characteristic and eliminates the noise propagation into the core processing unit 721. While the interface circuits are described as receiving inputs from within system 700, it should be appreciated that the input signals can be received from external systems as well.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A hysteresis receiver receiving an input signal and generating a receiver output, said hysteresis receiver comprising:
   a first inverter with a first threshold level, said first inverter receiving said input signal and generating a first output, wherein said first inverter switches said first output from one logic level to another if a strength of said input signal crosses said first threshold level;
   a second inverter with a second threshold level, said second inverter also receiving said input signal and generating a second output, wherein said second inverter switches from one logic level to another if a strength of said input signal crosses said second threshold level; and
   a logic controller circuit generating said receiver output based on said first output and said second output,
   wherein said receiver output is generated with a hysteresis window having boundaries determined by said first threshold and said second threshold;
   wherein said logic controller circuit propagates as said receiver output one of said first output and said second output if said first output logically equals said second output, and a prior value of said receiver output if said first output does not logically equal said second output; and further wherein said logic controller circuit comprises:
      an NAND gate generating an NAND output by performing a logical NAND operation of said first output and said second output;
      a NOR gate generating a NOR output by performing a logical NOR operation of said first output and said second output;
      a first switch being controlled by said NAND output, said first switch providing a logical high at a node if said NAND output equals 0;
      a second switch being controlled by said NOR output, said second switch providing a logical low at said node if said NOR output equals 1,
      whereby said node provides an inverted logical value for said receiver output.

2. The hysteresis receiver of claim 1, wherein said logic controller further comprises:
   a first inverter receiving said inverted logical value and generating a logical value for said receiver output; and
   a second inverter connected between an output path of said first inverter and said node, said second inverter maintaining a previous value of said receiver output at said node when said NAND output equals 1 and said NOR output equal 0.

3. A system comprising:
   a processor processing a plurality of bits;
   an interface circuit providing said plurality of bits to said processor, said interface circuit comprising
      a first inverter with a first threshold level, said first inverter receiving said input signal and generating a first output, wherein said first inverter switches said first output from one logic level to another if a strength of said input signal crosses said first threshold level;
      a second inverter with a second threshold level, said second inverter also receiving said input signal and generating a second output, wherein said second inverter switches from one logic level to another if a strength of said input signal crosses said second threshold level; and
      a logic controller circuit generating said receiver output based on said first output and said second output,
      wherein said receiver output is generated with a hysteresis window having boundaries determined by said first threshold and said second threshold;
   wherein said logic controller circuit propagates as said receiver output one of said first output and said second output if said first output logically equals said second output, and a prior value of said receiver output if said first output does not logically equal said second output; and further wherein said logic controller circuit comprises:
      an NAND gate generating an NAND output by performing a logical NAND operation of said first output and said second output;
      a NOR gate generating a NOR output by performing a logical NOR operation of said first output and said second output;

a first switch being controlled by said NAND output, said first switch providing a logical high at a node if said NAND output equals 0;

a second switch being controlled by said NOR output, said second switch providing a logical low at said node if said NOR output equals 1, whereby said node provides an inverted logical value for said receiver output.

4. The system of claim 3, wherein said logic controller further comprises:

a first inverter receiving said inverted logical value and generating a logical value for said receiver output; and a second inverter connected between an output path of said first inverter and said node, said second inverter maintaining a previous value of said receiver output at said node when said NAND output equals 1 and said NOR output equal 0.

5. The system of claim 3, wherein said interface circuit is contained on a board comprised in said system.

* * * * *